United States Patent
Archer et al.

(10) Patent No.: US 11,495,958 B2
(45) Date of Patent: Nov. 8, 2022

(54) OVERPOWER PROTECTION IN A POWER SUPPLY SYSTEM

(71) Applicant: ERP POWER, LLC, Moorpark, CA (US)

(72) Inventors: Michael Archer, Moorpark, CA (US); Louis Chen, Simi Valley, CA (US); James H. Mohan, Valencia, CA (US)

(73) Assignee: ERP POWER, LLC, Moorpark, CA (US)

( * ) Notice: Subject to any disclaimer, the term of this patent is extended or adjusted under 35 U.S.C. 154(b) by 141 days.

(21) Appl. No.: 17/204,823

(22) Filed: Mar. 17, 2021

(65) Prior Publication Data

US 2022/0094153 A1 Mar. 24, 2022

Related U.S. Application Data (60) Provisional application No. 63/082,717, filed on Sep. 24, 2020.

(51) Int. Cl.

| | |
|---|---|
| *H02H 3/42* | (2006.01) |
| *G01R 19/165* | (2006.01) |
| *H05B 47/20* | (2020.01) |
| *H02H 1/00* | (2006.01) |
| *G01R 19/10* | (2006.01) |

(52) U.S. Cl.
CPC ............ *H02H 3/42* (2013.01); *G01R 19/10* (2013.01); *G01R 19/16576* (2013.01); *H02H 1/0007* (2013.01); *H05B 47/20* (2020.01)

(58) Field of Classification Search
CPC ............ H05B 47/20–29; H02H 3/42; H03K 17/0822; H03K 17/0828
See application file for complete search history.

(56) References Cited

U.S. PATENT DOCUMENTS

| | | | |
|---|---|---|---|
| 4,937,697 A * | 6/1990 | Edwards | H02H 5/044 361/103 |
| 2011/0062886 A1 * | 3/2011 | Hung | H05B 45/3725 315/294 |
| 2017/0033552 A1 * | 2/2017 | Aras | H02H 3/006 |

* cited by examiner

*Primary Examiner* — Jared Fureman
*Assistant Examiner* — Christopher J Clark
(74) *Attorney, Agent, or Firm* — Lewis Roca Rothgerber Christie LLP (57) ABSTRACT

A method of overpower protection in a power supply system for driving a light source includes determining a voltage drop across a voltage-controlled resistor (VCR) coupled in series with the light source, calculating a power dissipation of the VCR based on the voltage drop and an output current of the power supply system, determining whether the power dissipation is greater than a power threshold, and in response to determining that the power dissipation is less than or equal to the power threshold, determining that an accumulated energy of the VCR is greater than zero, and decrementing the accumulated energy based on the power threshold and the power dissipation of the VCR.

20 Claims, 2 Drawing Sheets

OVERPOWER PROTECTION IN A POWER SUPPLY SYSTEM

CROSS-REFERENCE TO RELATED APPLICATION(S)

This application claims priority to, and the benefit of, U.S. Provisional Application No. 63/082,717 ("OVERPOWER PROTECTION FOR SERIES FET"), filed on Sep. 24, 2020, the entire content of which is incorporated herein by reference.

FIELD

Aspects of the present invention are related to light emitting diode (LED) drivers.

BACKGROUND

A light emitting diode (LED) is an electronic device that converts electrical energy (commonly in the form of electrical current) into light. The light intensity of an LED is primarily based on the magnitude of the driving current. Given that an LED luminosity is very sensitive to drive current changes, in order to obtain a stable luminous output without flicker, it is desirable to drive LEDs by a constant-current source.

Generally, lighting sources are powered by an input AC voltage of 110 or 220 VAC at 50 or 60 Hz line frequency. The input AC voltage is rectified via a rectifier and converted to a desired output voltage level that will be utilized by the LED. As any input power ripple may induce an output voltage ripple and output current ripple, a feedback loop that measures the output of the converter may be used to implement ripple control.

The above information disclosed in this Background section is only for enhancement of understanding of the invention, and therefore it may contain information that does not form the prior art that is already known to a person of ordinary skill in the art.

SUMMARY

Aspects of embodiments of the present invention are directed to a power supply system utilizing a secondary-side ripple controller that is isolated from the primary side of the power supply system and includes a voltage-controlled resistor (VCR). In some embodiments, the power supply system utilizes a secondary-side voltage threshold controller that operates in conjunction with a ripple controller. The voltage threshold controller can lower the voltage headroom at the secondary side to reduce or minimize power loses due to the ripple controller. According to some embodiments, the voltage threshold controller prevents damage to the VCR resulting from large voltage headrooms that may occur in certain situations by continuously monitoring the power dissipate of the VCR and shutting down the power supply system when the real-time power being dissipated by the VCR surpasses a particular limit.

According to some embodiments, there is provided a method of overpower protection in a power supply system configured to drive a light source, the method including: determining a voltage drop across a voltage-controlled resistor (VCR) coupled in series with the light source; calculating a power dissipation of the VCR based on the voltage drop and an output current of the power supply system; determining whether the power dissipation is greater than a power threshold; and in response to determining that the power dissipation is less than or equal to the power threshold, determining that an accumulated energy of the VCR is greater than zero; and decrementing the accumulated energy based on the power threshold and the power dissipation of the VCR.

In some embodiments, the determining the voltage drop across the VCR includes: measuring a VCR voltage at a first terminal of the VCR, the first terminal being coupled to the light source; and in response to determining the VCR voltage as being less than a voltage threshold, determining the voltage drop across the VCR as the VCR voltage.

In some embodiments, the voltage threshold is a set percentage of a zener voltage of a zener diode coupled to the first terminal of the VCR.

In some embodiments, the determining the voltage drop across the VCR includes: measuring a VCR voltage at a first terminal of the VCR, the first terminal being coupled to the light source; and in response to determining the VCR voltage as being greater than or equal to a voltage threshold, measuring an output voltage of a converter of the power supply system; and determining the voltage drop as a sum of the VCR voltage and a difference between the output voltage and a maximum voltage.

In some embodiments, the power threshold is 1 W to 5 W.

In some embodiments, the method further includes: estimating the output current of the power supply system based on a dimmer setting.

In some embodiments, the decrementing the accumulated energy includes: decrementing the accumulated energy by a value corresponding to a difference between the power threshold and the power dissipation.

In some embodiments, in response to determining that the power dissipation is greater than the power threshold, incrementing the accumulated energy based on the power dissipation.

In some embodiments, the incrementing the accumulated energy includes: incrementing the accumulated energy by a value corresponding to the power dissipation of the VCR.

In some embodiments, the method further includes: determining that the accumulated energy is greater than an energy threshold; and shutting down the power supply system for a period of time.

In some embodiments, the shutting down the power supply system includes: generating a first signal to deactivate a main switch of a converter of the power supply system.

In some embodiments, the energy threshold is 1 W to 5 W.

In some embodiments, the period of time is 10 s to 30 s.

In some embodiments, the method further includes: turning on the power supply system after the period of time has lapsed.

In some embodiments, the turning on the power supply system includes: generating a second signal to allow a main switch of the power supply system to resume switching operation.

According to some embodiments, there is provided a power supply system including: a converter configured to generate a drive signal for powering a light source; a voltage-controlled resistor (VCR) coupled to a secondary-side of the converter and the light source; and a secondary controller including: a processor; and a processor memory local to the processor, wherein the processor memory has stored thereon instructions that, when executed by the processor, cause the processor to perform: determining a voltage drop across the VCR; calculating a power dissipation of the VCR based on the voltage drop and an output current of the power supply system; determining whether the power dissipation is greater than a power threshold; and in response to determining that the power dissipation is less than or equal to the power threshold, determining that an accumulated energy of the VCR is greater than zero; and decrementing the accumulated energy based on the power threshold and the power dissipation of the VCR.

In some embodiments, the determining the voltage drop across the VCR includes: measuring a VCR voltage at a first terminal of the VCR, the first terminal being coupled to the light source; in response to determining the VCR voltage as being less than a voltage threshold, determining the voltage drop across the VCR as the VCR voltage; and in response to determining the VCR voltage as being greater than or equal to the voltage threshold, measuring an output voltage of the converter; and determining the voltage drop as a sum of the VCR voltage and a difference between the output voltage and a maximum voltage.

In some embodiments, the decrementing the accumulated energy includes: decrementing the accumulated energy by a value corresponding to a difference between the power threshold and the power dissipation.

In some embodiments, in response to determining that the power dissipation is greater than the power threshold, incrementing the accumulated energy based on the power dissipation.

In some embodiments, the instructions, when executed by the processor, further cause the processor to perform: determining that the accumulated energy is greater than an energy threshold; and shutting down the power supply system for a period of time.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

The detailed description set forth below is intended as a description of example embodiments of a power supply system with a ripple correction circuit, provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
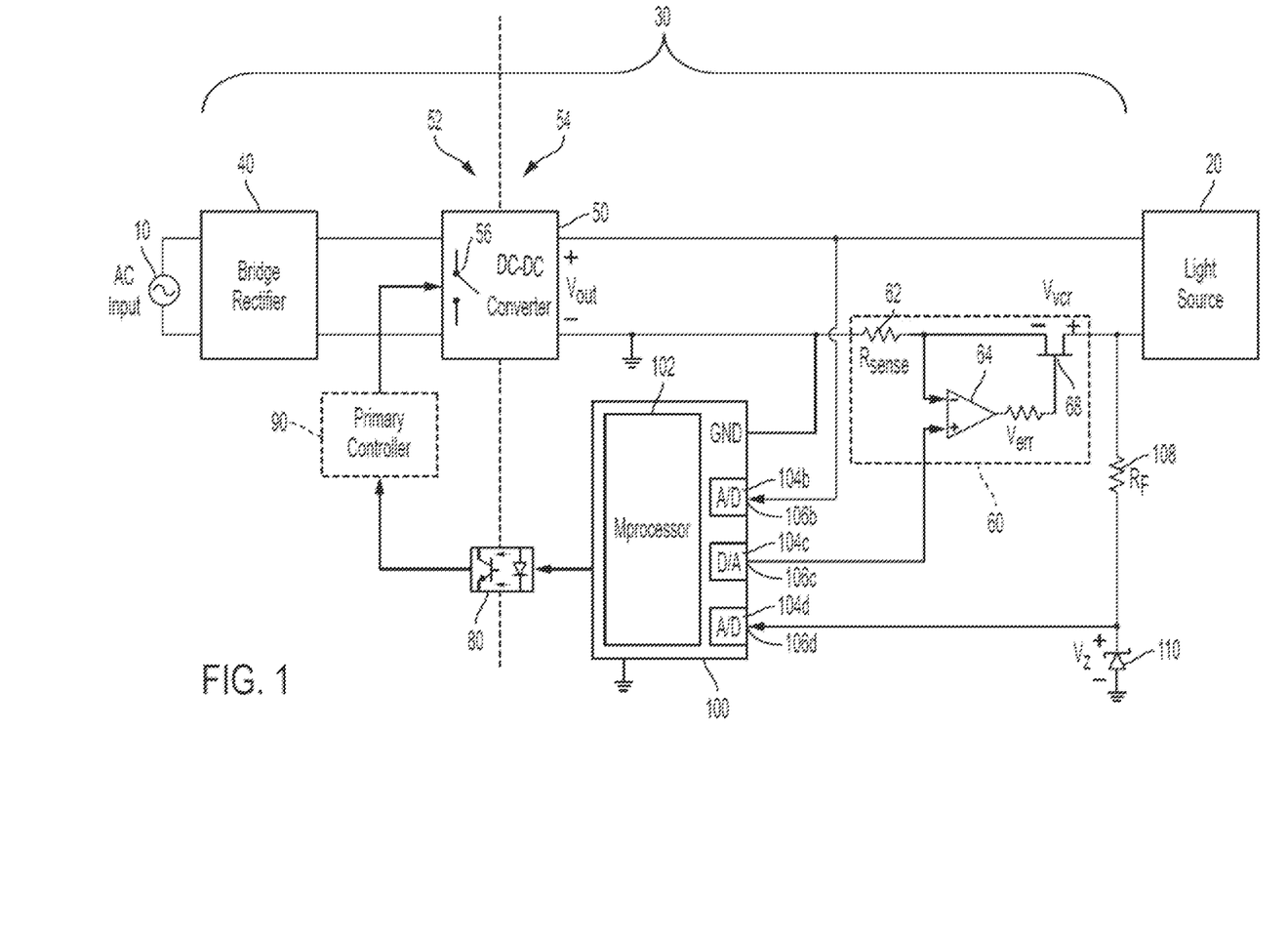
FIG. 1 is a block diagram illustrating a lighting system including a power supply system with ripple correction and feedback, according to some embodiments of the present disclosure.

FIG. 1 is a block diagram illustrating a lighting system including a power supply system with ripple correction and feedback, according to some embodiments of the present disclosure.

According to some embodiments, the lighting system 1 includes an input source 10, a light source 20, and a power supply system 30 (e.g., a switched-mode power supply) for powering and controlling the brightness of the light source 20 based on the signal from the input source 10.

The input source 10 may include an alternating current (AC) power source that may operate at a voltage of 100 Vac, a 120 Vac, a 240 Vac, or 277 Vac, for example. The input source 10 may also include a dimmer electrically powered by said AC power sources. The dimmer may modify (e.g., cut/chop a portion of) the input AC signal according to a dimmer level before sending it to the power supply system 30, and thus variably reduces the electrical power delivered to the power supply system 30 and the light source 20. In some examples, the dimmer may be a TRIAC or ELV dimmer, and may chop the front end or leading edge of the AC input signal. According to some examples, the dimmer interface may be a rocker interface, a tap interface, a slide interface, a rotary interface, or the like. A user may adjust the dimmer level by, for example, adjusting a position of a dimmer lever or a rotation of a rotary dimmer knob, or the like. The light source 20 may include one or more light-emitting-diodes (LEDs) or an arc or gas discharge lamp with electronic ballasts, such as high intensity discharge (HID) or fluorescent lights.

In some embodiments, the power supply system 30 includes a rectifier 40, a converter 50, and a ripple control system (e.g., a secondary-side ripple control system) 60.

The rectifier 40 may provide a same polarity of output for either polarity of the AC signal from the input source 10. In some examples, the rectifier 40 may be a full-wave circuit using a center-tapped transformer, a full-wave bridge circuit with four diodes, a half-wave bridge circuit, or a multi-phase rectifier.

The converter (e.g., the DC-DC converter) 50 converts the rectified AC signal generated by the rectifier 40 into a drive signal for powering and controlling the brightness of the light source 20. The drive signal may depend on the type of the one or more LEDs of the light source 20. For example, when the one or more LEDs of the light source 20 are constant current LEDs the drive signal may be a variable voltage signal, and when the light source 20 requires constant voltage, the drive signal may be a variable current signal. In some embodiments, the converter 50 includes a boost converter for maintaining (or attempting to maintain) a constant DC bus voltage on its output while drawing a current that is in phase with and at the same frequency as the line voltage (by virtue of a PFC controller). Another switched-mode converter (e.g., a transformer) inside the converter 50 produces the desired output voltage from the DC bus. In some examples, the converter 50 may include a PFC controller for improving (e.g., increasing) the power factor of the load on the input source 10 and reducing the total harmonic distortions (THD) of the power supply system 30. As shown in FIG. 1, in some embodiments, the PFC controller 90 is external to the converter 50 and controls/drives the on/off state of a main switch 56 within the converter 50. The converter has a primary side 52 and a secondary side 54 that is electrically isolated from, and inductively coupled to, the primary side 52.

In the related art, ripple control at the output of the converter 50 may be achieved by making signal measurements (e.g., voltage and/or current measurements) of the converter output and feeding the measured signal (e.g., measured voltage and/or current) back to the input of the converter 50. When an outlier ripple is measured, a voltage control loop may issue a change in switching frequency for the primary side DC-DC converter (e.g., a change in switching frequency of a main switch 56 of the converter 50), thus adjusting the output voltage of the secondary side 54 into the light source 20. However, the feedback delay may make it difficult for the converter 50 to implement corrections in real time with output ripples. Further, this delay may result in positive feedback and loop instability, which may produce undesirable voltages at the output of the converter 50.

According to some embodiments, the ripple control system 60 (also referred to as a secondary-side ripple control circuit/stage) is electrically coupled to the secondary side 54 of the converter 50 and electrically isolated from the primary side 52. The ripple control system 60 includes a sense resistor 62, an operational amplifier (also referred to as an error amplifier) 64, a secondary controller (e.g., a secondary-side voltage threshold controller) 100, and a voltage-controlled resistor (VCR, e.g., a linear pass element) 68. The sense resistor 62 may be positioned between the output of the converter 50 and the light source 20 and is connected electrically in series with the light source 20. The ripple control system 60 measures the output current $I_{sense}$ of the converter 50 via the sense resistor 62, and provides the measured signal (current/voltage) to the first input terminal (e.g., the negative terminal) of the error amplifier 64 to compare with a reference signal (e.g., a reference current/voltage) supplied by the secondary controller 100. The error signal (also referred to as a gate control signal) $V_{err}$ that is then generated by the error amplifier 64 is used to control the voltage drop across the VCR 68.

According to some embodiments, the reference signal generated by the secondary controller 100 is used to determine (e.g., set) the DC-signal level that the input voltage $V_{in}$ of the light source 20 is to be regulated to. In some examples, the secondary controller 100 may provide a fixed/constant voltage to the error amplifier 64. However, embodiments of the present disclosure are not limited thereto. For example, in embodiments in which the input source 10 includes a dimmer, the secondary controller 100 adjusts the reference signal (e.g., the reference voltage/current) according to the intensity setting at the dimmer. In some examples, the secondary controller 100 provides a reference signal to a second input terminal (e.g., the positive terminal) of the error amplifier 64.

According to some embodiments, the VCR 68 is electrically connected in series with the sense resistor 62 and the light source 20. In some embodiments, the VCR 68 is a field effect transistor (FET), such as a junction FET (JFET) that operates in the quasi-saturation region (e.g., linear/ohmic region) and functions as a variable resistor, whose resistance is controlled by the gate voltage. However, embodiments of the present disclosure are not limited thereto, and any suitable 3-terminal or 4-terminal active device may be utilized as the VCR, such as a metal-oxide-semiconductor field-effect transistor (MOSFET) or the like.

According to some embodiments, the error signal $V_{err}$ from the error amplifier 64 controls the resistance of the VCR 68. In some examples, the resistance of the VCR 68 may vary from about 500Ω to about 10 kΩ depending on the error signal. However, embodiments of the present disclosure are not limited thereto and the on-resistance of the VCR 68 may have a narrower or wider range depending on the VCR used, the dynamic range available, etc.

The DC voltage that is applied to the load is the output voltage $V_{out}$ of the DC-DC converter 50 minus the voltage drop across the VCR 68. In some embodiments, when the converter output voltage $V_{out}$ rises above the desired value, which corresponds to the regulated voltage of the secondary controller 100, the ripple control system 60 increases the resistance of the VCR 68 until the voltage drop across the VCR 68 counteracts (e.g., rises sufficiently to cancel) the rise in the converter output voltage $V_{out}$. Conversely, when the converter output voltage $V_{out}$ drops below the desired value, the ripple control system 60 decreases the resistance of the VCR 68 until the voltage drop counteracts (e.g., decreases sufficiently to cancel) the rise in the converter output voltage $V_{out}$. Therefore, as the ripple control system 60 dynamically adjusts the resistance (and hence the voltage across) the VCR 68 in response to (and to compensate for) the instantaneous changes in the output voltage $V_{out}$ of the converter, the voltage signal at the input of the light source 20 may exhibit little to no ripple after the secondary side ripple control stage 60. In effect, the voltage drop across the VCR 68 (e.g., across the source and drain terminals of the JFET) act as a headroom for mitigating ripple in the secondary side voltage of the power supply system 30.

Accordingly, the ripple control system 60 observes and eliminates ripples quickly and efficiently as the reacting VCR 68 is not significantly delayed in how quickly it can respond to changes in the converter output signal. Further, the inclusion of the VCR 68 may eliminate the need for additional primary side components that would otherwise be needed to perform the same correction. The need for opto-couplers used to transmit feedback control data from the secondary side to the primary side is reduced as the need to communicate between isolated circuits is reduced (or minimized). The decrease in components translates to a decrease in cost as the component count for performing correction is reduced.

While the topology of the related art may mitigate ripples so that they are within a tolerance of 20% after ripple correction, the power supply system 30 utilizing the VCR 68 on the secondary side, according to some embodiments, may mitigate ripples so that the resulting DC output into the light source 20 is within a tolerance of 1%.

While the ripple control system 60 may substantially reduce or eliminate ripple at the input of the light source 20 by modifying the dynamic resistance $R_{dyn}$ of the VCR 68, this induced resistance $R_{dyn}$ may lead to additional power losses in the power supply system. The resistance $R_{dyn}$ dissipates energy at a rate of $$P = I^2 * R_{dyn} \qquad \text{(Eq. 1)}$$

where I is the drive current produced by the converter 50 and P is the power loss at the VCR 68. At a constant desired drive current, the power dissipated is dependent on the value of $R_{dyn}$. A larger voltage drop across the VCR 68 results in a larger induced resistance $R_{dyn}$. This translates to an increase in power dissipation by the VCR 68.

In examples in which the power supply system 30 is designed for light sources having a particular drive voltage, the converter 50 may be designed to provide a voltage that is slightly higher than the drive voltage (e.g., a voltage that is equal to the drive voltage plus a ripple control headroom). As such, the voltage drop across the VCR 68 may be managed to be low (e.g., about 0.1 V to about 2 V), which can limit (e.g., minimize) the power loss due to the VCR 68. For example, when the light source 20 has a 24 V input, the converter output $V_{out}$ may be about 24.5 V to about 25 V, and when the light source 20 has a 37 V input, the converter output $V_{out}$ may be about 37.5 V to about 38 V. In such examples, the voltage drop across the VCR 68 may be about 0.5 V to about 1 V.

However, when designing a converter that is compatible with a variety of light sources with a wide range of drive voltages, the converter may be designed at the highest voltage within the range, and thus, the power loss due to the resistance of the VCR may be more prominent when driving a light source with a low power drive voltage.

The power supply system, according to some embodiments, includes a voltage control loop for appropriately lowering the output voltage of the power supply system in such examples, which can reduce (e.g., minimize) the power loss of the VCR 68, even when the power supply system is designed to be compatible with a variety of light sources with a wide range of drive voltages.

In some examples, the feedback signal from the secondary controller 100, which is on the secondary side 54 of the converter 50, is communicated through the primary-secondary barrier of the converter 50 via an optocoupler 80, which enables communication between the primary and secondary sides 52 and 54 of the converter 50 while maintaining the electrical isolation between the two sides. In some embodiments, the feedback signal is received by a primary controller (e.g., a primary-side PFC controller) 90, which may perform power factor correction for the power supply system 32. In some embodiments (e.g., when the primary controller 90 is integrated into the converter 50), the feedback signal is provided directly to the input of the converter 50.

The secondary controller 100 operates in conjunction with the ripple control system 60, which performs ripple correction. Accordingly, as described above, the power supply system 32 with secondary ripple control can lower overall system cost due to fewer optocouplers used in the design, and can improve accuracy and reduce (e.g., minimize) delay as the VCR 68 may react as fast as the changes in its gate signal are produced. As such, power factor (PF) and total harmonic distortion (THD) issues that generally result from feedback control delays from secondary to primary sides, can be avoided by the secondary controller 100. Further, the secondary ripple control is isolated from the primary high-voltage side and inherently lowers the voltage headroom at the secondary side to reduce or minimize power loses across the VCR 68.

According to some embodiments, the secondary controller 100 is configured to control the voltage level of the converter output $V_{out}$. In some embodiments the secondary controller 100 includes a programmable processor (e.g., a programmable microprocessor) 102 and a plurality of analog-to-digital (A/D) and digital-to-analog (D/A) converters 104a-104b that are connected to input and output terminals/ports 106b-106d of the secondary controller 100.

According to some embodiments, the secondary controller 100 samples (e.g., measures) the output voltage $V_{out}$ of the converter 50 at the terminal 106b and converts the readings to digital binary form via the A/D converter 104b for further processing by the programmable processor 102.

In some embodiments, the secondary controller 100 supplies the reference signal (e.g., a reference regulation voltage/current $V_{reg}/I_{reg}$) to the error amplifier 64 (e.g., to the positive input terminal of the error amplifier 64) to set the DC-signal level that the input voltage $V_{in}$ of the light source 20 is to be regulated to. In some examples, the programmable processor 102 generates a digital binary reference value and the D/A converter 104c converts the binary reference value to the analog reference signal to be supplied to the error amplifier 64 via the third terminal 106c. In examples in which the light source 20 includes a dimmable LED, the programmable processor 102 may generate the digital binary reference value based on a dimmer setting (which may range from 0-100%).

According to some embodiments, the secondary controller 100 senses (e.g., measures) the voltage $V_{VCR}$ across the VCR 68 via the fourth terminal 106d and the third A/D converter, which converts the sensed analog voltage at the fourth terminal 106d to a binary signal that may be processed by the programmable processor 102. In some embodiments, the fourth terminal 106d is coupled to the VCR 68 through a feedback resistor ($R_F$) 108 and is coupled to a zener diode 110. In some examples, the anode of the zener diode 110 is connected to ground (e.g., electrical ground) and the cathode of the zener diode 110 is connected to the resistor 108 and the fourth terminal 106d. The resistor 108 may have a resistance of about 10 kΩ to about 499 kΩ (e.g., about 100 kΩ).

The zener diode 110 is configured to protect the secondary controller 100 by preventing an unsuitably large voltage from being applied to the fourth terminal 106d when $V_{VCR}$ is larger than the rated voltage of the secondary controller 100. In so doing, the zener diode 110 caps (e.g., limits) the voltage at the fourth terminal 106d to the zener voltage, which may be about 3.3 V to about 5 V. However, by limiting the sensed voltage at the fourth terminal 106d, the voltage drop across the VCR 68 may no longer be accurately observed above a certain voltage threshold (e.g., the zener voltage). Thus, the gain in the primary controller 90 may not be appropriate to bring down the voltage output of the converter 50 quick enough to ensure that power loses are minimized across the VCR 68.

According to some embodiments, when the sensed VCR voltage $V_{VCR}$ is less than a threshold, which may be a set percentage (e.g., 90% or 95%) of the zener voltage $V_z$ (e.g., when $V_{VCR}<0.9*V_z$), the programmable processor 102 determines that the sensed voltage $V_{VCR}$ is the true voltage drop across the VCR 68. As such, the processor 102 determines that the converter output voltage $V_{out}$ has overshot by the DC component of $V_{VCR}$ and signals the primary controller 90 or the converter 50 to adjust (e.g., reduce) the converter output voltage $V_{out}$ accordingly.

In some embodiments, when the sensed voltage $V_{VCR}$ is greater than or equal to a set percentage (e.g., 5% or 10%) of the zener voltage $V_z$ (e.g., when $V_{VCR}>=0.9*V_z$), the actual voltage across the VCR 68 may be masked by operation of the zener diode. As such, the processor 102 may correct the converter output voltage $V_{out}$ by an amount greater than the sensed voltage $V_{VCR}$. In some embodiments, the processor 102 determines that the converter output voltage $V_{out}$ has overshot by the sensed voltage $V_{VCR}$ plus the difference between the measured output voltage $V_{out}$ (as observed through the terminal 106b) and a set or predefined maximum output voltage $V_{max}$. In other words, the processor 102 correct the converter output by a calculated voltage drop (e.g., a correction value) equal to $V_{VCR}+|V_{out}-V_{max}|$. The maximum output voltage $V_{max}$, which may be programmed in the processor 102, represents a not-to-exceed voltage at the output of the converter 50. It is desirable for the output voltage of the converter 50 to not exceed the programed maximum voltage output. For example, for a power supply system that is designed to work with a wide variety of light sources, the maximum output voltage $V_{max}$ may be programmed to be about 42 V. The calculated voltage drop may provide a more accurate reading of the actual voltage drop across the VCR 68 when the sensed voltage $V_{VCR}$ is masked by the zener voltage V. This calculated voltage drop (i.e., the calculated correction value for $V_{VCR}$) may then be used to adjust the gain in the primary controller 90/converter 50. According to some examples, the overshoot of the converter output may occur on initial turn on or during dynamic load changes such as when dimming.

According to some embodiments, the processor 102 can learn the input voltage of the light source 20 and store the learned input voltage in a memory of the secondary controller 100. The processor 102 then sets the maximum output voltage $V_{max}$ as the learned input voltage plus a margin (of, e.g., 0.2 V to about 1 V).

In some embodiments, the secondary controller 100 communicates the calculated voltage drop/correction value, through a control signal, to the primary controller 90 or the converter 50 via the optocoupler 80. In some examples, the control signal output by the secondary controller 100 may be a pulse width modulated (PWM) signal that may further be demodulated via an RC filter when desired. The correction value allows the converter 50 to adjust the output voltage $V_{out}$ to better match the input voltage of the light source 20. The DC voltage that is then applied to the light source 20 is the voltage output of the DC-DC converter minus the voltage drop across the VCR 68. According to some embodiments, this results in a voltage signal with little to no ripple after the secondary side ripple control stage. The added benefit of the voltage threshold control loop is that the smaller voltage drop across the FET results in lower power dissipation.

Accordingly, as described above, the power supply system with ripple control can lower overall system cost due to fewer optocouplers used in the design, and can improve accuracy and reduce (e.g., minimize) delay as the FET can react as fast as the changes in the gate signal are produced. Further, the functionality of physical circuitry can be provided digitally using the onboard programmable processor, thus, eliminating the need for additional physical components. Further, the processor can be programmed to automatically lower the voltage output of the DC-DC converter to reduce or minimize power dissipation in the voltage-controlled resistor.

As noted above, any voltage drop across the VCR 68 leads to a power dissipation in the form of heat. The VCR 68 may become damaged if excess power is dissipated continuously during operation of the power supply system 30. A problem could arise when the voltage headroom at the secondary side 54 cannot be lowered quickly enough by the secondary controller 100 and the primary controller 90.

In some examples, the power supply system 30 may be limited to a relatively slow secondary-to-primary control loop. This may be due to the fact that TRIAC dimmers generally cannot tolerate rapid changes in output and may even shutdown for some time (e.g., a second) in the presence of such change, which is undesirable as it may cause the light source 20 to turn off momentarily. To prevent this from happening, the power supply system 30 may limit (or slow down) how fast the output voltage $V_{OUT}$ may change. However, in certain conditions, such as when a user repeatedly changes a dimmer setting up and down or when experiencing brown-outs (where the input voltage cycles on and off rapidly), a significant headroom may develop at the secondary side 54 because the power supply system 30 cannot instantaneously implement changes to its output. If these conditions persist, the VCR 68 may dissipate excess power for longer periods of time than it can handle and may therefore be permanently damaged. In some examples, physical and space limitation may prevent the power supply system 30 from using a large package VCR, which could have sufficiently high voltage/power rating to tolerate the large headroom that may develop. Further, space and cost constraints may prevent the use of a thermistor near the VCR 68 as a means of monitoring its temperature.

In some embodiments, to prevent catastrophic failure of the VCR 68, the secondary controller 100 implements a process for estimating the energy dissipated by the VCR 68 and for shutting down the power supply system 30 for a certain amount of time, when the estimated energy surpasses a programmed threshold. The VCR 68 may be rated to operate a certain power level at a particular temperature rating. In the absence of a thermistor, in some embodiments, the secondary controller 100 simulates the temperature of the VCR 68 through estimating its energy dissipation and ensures that the rated temperature of the VCR 68 is not exceeded.

Figure 2:
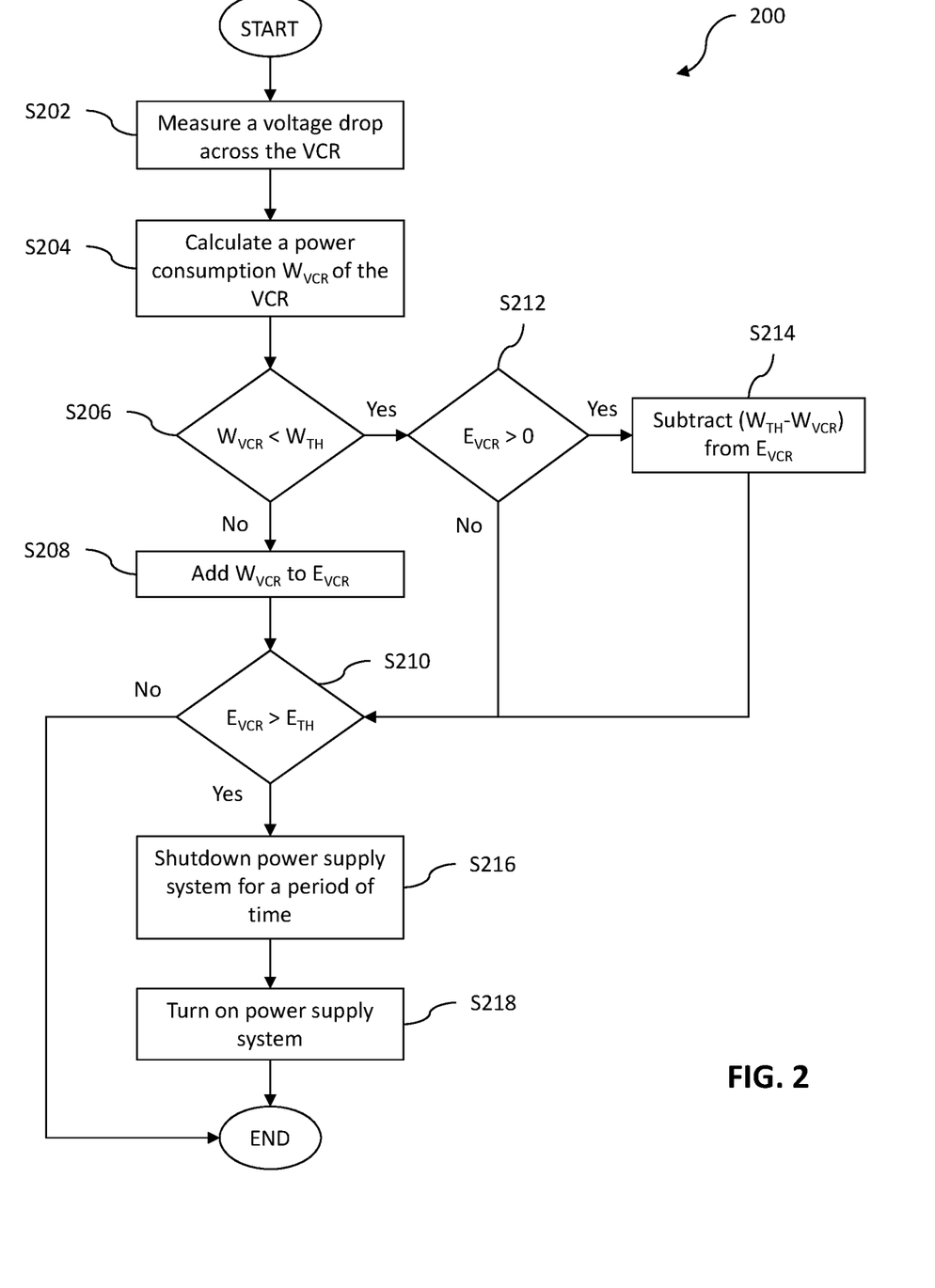
FIG. 2 illustrates a process of overpower protection in the power supply system, according to some example embodiments of the present disclosure.

FIG. 2 illustrates a process 200 of overpower protection in the power supply system 30, according to some example embodiments of the present disclosure.

According to some embodiments, the secondary controller 100 determines a voltage drop $V_{VCR}$ across the VCR 68 (S202). In so doing, the secondary controller 100 (e.g., the processor 102) measures the VCR voltage at a terminal of the VCR 68, which is coupled to the light source 20, via the fourth terminal 106d. The secondary controller 100 then compares the VCR voltage to a voltage threshold, which may be a set percentage (e.g., 90% or 95%) of the zener voltage $V_z$. When the VCR voltage is less than the voltage threshold, the zener diode 110 does not mask the voltage measurement at the fourth terminal 106d, and the programmable processor 102 determines the VCR voltage to be the voltage drop $V_{VCR}$ across the VCR 68. When the VCR voltage is greater than or equal to the threshold voltage, the zener diode 110 may be masking the actual voltage drop $V_{VCR}$ across the VCR 68, and thus the programmable processor 102 estimates the voltage drop $V_{VCR}$ based on the measured VCR voltage, the measured output voltage $V_{OUT}$ (at the terminal 106b), and a maximum voltage (e.g., the maximum output voltage) $V_{max}$. In some embodiments, the programmable processors determines (e.g., estimate or calculates) the voltage drop $V_{VCR}$ as a sum of the measured VCR voltage and a difference between the output voltage $V_{OUT}$ and the maximum voltage $V_{max}$ (e.g., $V_{VCR}$(measured)+$|V_{out}-V_{max}|$).

In some embodiments, the programmable processor 102 then calculates the power consumption/dissipation of the VCR 68 based on the determined voltage drop and an output current (e.g., an estimated output current) of the converter 50 (S204). While, in some examples, the secondary controller 100 may not have direct knowledge of the actual output current of the converter 50, the secondary controller 100 sets/determines the current that the output is to be regulated to ($I_{REG}$). In some examples, this regulated current $I_{REG}$ may be determined based on the dimmer setting. While the desired regulated current $I_{REG}$ may deviate from the actual output current of converter 50 (e.g., by +/−5%), it is sufficiently close to act as an estimate of the converter output current. Thus, in some embodiments, the programmable processor 102 multiplies the regulated current $I_{REG}$ by the determined voltage drop to obtain (an estimate of) the real-time power dissipation $W_{VCR}$ of the VCR 68.

The programmable processor 102 then compares the power dissipation $W_{VCR}$ of the VCR 68 with a power threshold $W_{TH}$ (S206). In some examples, the power threshold $W_{TH}$ corresponds to the maximum power that the VCR 68 can withstand under continuous operation. In some examples, the power threshold $W_{TH}$ may be about 1 W to about 5 W.

In some embodiments, when the real-time power dissipation $W_{VCR}$ is greater than or equal to this threshold $W_{TH}$, the processor 102 increments an accumulated energy $E_{VCR}$ of the VCR 68 based on the power dissipation $W_{VCR}$ (S208). In some example, the processor 102 may increment the accumulated energy by the multiplication of power dissipation $W_{VCR}$ by 1 second or 1000 ms (i.e., $W_{VCR}$ or 1000 $W_{VCR}$) depending on the units of the accumulated energy $E_{VCR}$ (e.g., as W·s or W·ms). This is done to reflect the fact that the higher the real-time power dissipation of the VCR 68 is, the faster its temperature will rise. The processor 102 then proceeds to compare the accumulated energy $E_{VCR}$ with a threshold energy $E_{TH}$ (S210).

According to some embodiments, when the real-time power dissipation $W_{VCR}$ is less than the power threshold $W_{TH}$, the processor 102 first determines whether the accumulated energy $E_{VCR}$ is greater than zero or not (S212). When the accumulated energy is greater than zero, the processor 102 then decrements the accumulated energy $E_{VCR}$ based on the power threshold $W_{TH}$ and the real-time power dissipation $W_{VCR}$ (S214). In some embodiments, the processor 102 decrements the accumulated energy $E_{VCR}$ by a value equal to the multiplication of 1 second or 1000 ms and the difference between the power threshold $W_{TH}$ and the power dissipation $W_{VCR}$ (i.e., by value equal to $W_{TH}-W_{VCR}$ or $1000 \times (W_{TH}-W_{VCR})$), depending on the units of the accumulated energy $E_{VCR}$ (e.g., as W·s or W·ms). The processor 102 may confirm than the accumulated energy $E_{VCR}$ is positive before decrementing to ensure that the accumulated energy $E_{VCR}$ does not become zero after the decrementing operation. Here, the decrease in the accumulated energy $E_{VCR}$ may be done to reflect the fact that the temperature of the VCR 68 may decrease (thus reducing any risk of harm to it) when the power dissipation of the VCR 68 is low (e.g., zero). Further, by decrementing the accumulated energy $E_{VCR}$ in this manner, the processor 102 reduces the accumulated energy $E_{VCR}$ by a greater amount when the real-time power dissipation $W_{VCR}$ is closer to zero than when it is closer to the power threshold $W_{TH}$. This is done to reflect the fact that the VCR 68 experiences a greater/faster temperature drop when the real-time power dissipation $W_{VCR}$ is lower.

The processor 102 then proceeds to compare the accumulated energy $E_{VCR}$ with a threshold energy $E_{TH}$ (S210). The processor may also do so when the accumulated energy $E_{VCR}$ is zero (e.g., at startup). Here, the threshold energy $E_{TH}$ represents a point after which there is a risk of damage to the VCR 68. According to some examples, this threshold may represent a point at which the VCR 68 will heat up past its maximum junction temperature rating in about 10 seconds, when the power supply system 30 is at a maximum rated temperature (e.g., 70° C. case temperature). In some examples, the energy threshold $E_{TH}$ may be about 5 J to about 50 J.

In some embodiments, when the accumulated energy $E_{VCR}$ is greater than the threshold energy $E_{TH}$, the processor 102 may initiate the shutdown of the converter 50 for a period of time (S216). For example, the secondary controller 100 may generate a signal that results in the deactivation of the main switch 56. The shutdown may be performed to remove the current passing through the VCR 68, thus allowing its temperature to drop and eliminating the chance of failure of the VCR 68. The period of time that the converter 50 is shut down may be a long enough window to ensure that the VCR 68 is sufficiently cool to safely resume normal operation. In some examples, this shutoff period of time may be about 10 s to about 30 s (e.g., 10 s). When in shutdown, the power supply system 30 may override/ignore any user input and maintain the light source in the off state.

Once the shutdown period has lapsed, the processor 102 resumes normal operation of the converter 50 (S218). For example, the secondary controller 100 may generate a second signal that allows the main switch 56 to resume switching operation to bring the output current/voltage of the converter 50 to the desired value. In some examples, the secondary controller 100 may signal the primary controller 90 to drive the output of the converter 50 such that is reaches the desired level as defined by the dimmer setting.

According to some embodiments, the processes described above (i.e., S202-S218) may be performed continuously in a loop that repeats with a certain frequency (e.g., 1 kHz). Thus, the secondary controller 100 continuously monitors the power dissipation at the VCR 68 and causes the converter 50 to shut down when the real-time power being dissipated by the VCR 68 surpasses a set threshold limit. In some embodiments, the processes performed by the processor 102 may be programmed in software, thus allowing the overpower protection to be performed using the existing power supply system 30 and without the need for additional hardware (such as a thermistor or a large VCR) or any changes to the existing hardware (such as rerouting/adding traces, etc.). Therefore, the process may be implemented at no additional cost. Further, the overpower protection scheme is independent of the type of light source 20 and may be utilized with a light source of any voltage rating.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "substantially", "about", and similar terms are used as terms of approximation and not as terms of degree, and are intended to account for the inherent variations in measured or calculated values that would be recognized by those of ordinary skill in the art.

As used herein, the terms "use", "using", and "used" may be considered synonymous with the terms "utilize", "utilizing", and "utilized", respectively.

The LED driver with an independent power feed for the RF communications module and/or any other relevant devices or components according to embodiments of the present invention described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the LED driver may be implemented on a flexible printed circuit film, a tape carrier package (TCP), a printed circuit board (PCB), or formed on the same substrate. Further, the various components of the LED driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A method of overpower protection in a power supply system configured to drive a light source, the method comprising:
    determining a voltage drop across a voltage-controlled resistor (VCR) coupled in series with the light source;
    calculating a power dissipation of the VCR based on the voltage drop and an output current of the power supply system;
    determining whether the power dissipation is greater than a power threshold; and
    in response to determining that the power dissipation is less than or equal to the power threshold,
        determining that an accumulated energy of the VCR is greater than zero; and
        decrementing the accumulated energy based on the power threshold and the power dissipation of the VCR.

2. The method of claim 1, wherein the determining the voltage drop across the VCR comprises:
    measuring a VCR voltage at a first terminal of the VCR, the first terminal being coupled to the light source; and
    in response to determining the VCR voltage as being less than a voltage threshold,
        determining the voltage drop across the VCR as the VCR voltage.

3. The method of claim 2, wherein the voltage threshold is a set percentage of a zener voltage of a zener diode coupled to the first terminal of the VCR.

4. The method of claim 1, wherein the determining the voltage drop across the VCR comprises:
    measuring a VCR voltage at a first terminal of the VCR, the first terminal being coupled to the light source; and
    in response to determining the VCR voltage as being greater than or equal to a voltage threshold,
        measuring an output voltage of a converter of the power supply system; and
        determining the voltage drop as a sum of the VCR voltage and a difference between the output voltage and a maximum voltage.

5. The method of claim 1, wherein the power threshold is 1 W to 5 W.

6. The method of claim 1, further comprising:
    estimating the output current of the power supply system based on a dimmer setting.

7. The method of claim 1, wherein the decrementing the accumulated energy comprises:
    decrementing the accumulated energy by a value corresponding to a difference between the power threshold and the power dissipation.

8. The method of claim 1, wherein in response to determining that the power dissipation is greater than the power threshold,
    incrementing the accumulated energy based on the power dissipation.

9. The method of claim 8, wherein the incrementing the accumulated energy comprises:
    incrementing the accumulated energy by a value corresponding to the power dissipation of the VCR.

10. The method of claim 1, further comprising:
    determining that the accumulated energy is greater than an energy threshold; and
    shutting down the power supply system for a period of time.

11. The method of claim 10, wherein the shutting down the power supply system comprises:
    generating a first signal to deactivate a main switch of a converter of the power supply system.

12. The method of claim 10, wherein the energy threshold is 1 W to 5 W.

13. The method of claim 10, wherein the period of time is 10 s to 30 s.

14. The method of claim 10, further comprising:
    turning on the power supply system after the period of time has lapsed.

15. The method of claim 14, wherein the turning on the power supply system comprises:
    generating a second signal to allow a main switch of the power supply system to resume switching operation.

16. A power supply system comprising:
    a converter configured to generate a drive signal for powering a light source;

a voltage-controlled resistor (VCR) coupled to a secondary-side of the converter and the light source; and a secondary controller comprising:

a processor; and a processor memory local to the processor, wherein the processor memory has stored thereon instructions that, when executed by the processor, cause the processor to perform:

determining a voltage drop across the VCR;

calculating a power dissipation of the VCR based on the voltage drop and an output current of the power supply system;

determining whether the power dissipation is greater than a power threshold; and in response to determining that the power dissipation is less than or equal to the power threshold, determining that an accumulated energy of the VCR is greater than zero; and decrementing the accumulated energy based on the power threshold and the power dissipation of the VCR.

17. The power supply system of claim 16, wherein the determining the voltage drop across the VCR comprises:

measuring a VCR voltage at a first terminal of the VCR, the first terminal being coupled to the light source;

in response to determining the VCR voltage as being less than a voltage threshold, determining the voltage drop across the VCR as the VCR voltage; and in response to determining the VCR voltage as being greater than or equal to the voltage threshold, measuring an output voltage of the converter; and determining the voltage drop as a sum of the VCR voltage and a difference between the output voltage and a maximum voltage.

18. The power supply system of claim 16, wherein the decrementing the accumulated energy comprises:

decrementing the accumulated energy by a value corresponding to a difference between the power threshold and the power dissipation.

19. The power supply system of claim 16, wherein in response to determining that the power dissipation is greater than the power threshold, incrementing the accumulated energy based on the power dissipation.

20. The power supply system of claim 16, wherein the instructions, when executed by the processor, further cause the processor to perform:

determining that the accumulated energy is greater than an energy threshold; and shutting down the power supply system for a period of time.

* * * * *